United States Patent
Tang et al.

(10) Patent No.: US 7,948,810 B1
(45) Date of Patent: May 24, 2011

(54) POSITIVE AND NEGATIVE VOLTAGE LEVEL SHIFTER CIRCUIT

(75) Inventors: Qiang Tang, Cupertino, CA (US); Bo Wang, Sunnyvale, CA (US); Chih-Hsin Wang, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 205 days.

(21) Appl. No.: 12/250,021

(22) Filed: Oct. 13, 2008

Related U.S. Application Data

(60) Provisional application No. 60/980,017, filed on Oct. 15, 2007.

(51) Int. Cl.
*G11C 7/00* (2006.01)

(52) U.S. Cl. .......... 365/189.11; 365/189.12; 365/189.07

(58) Field of Classification Search ............. 365/189.11, 365/189.12, 189.07, 191, 189.05, 189.03, 365/189.08
See application file for complete search history.

(56) References Cited

U.S. PATENT DOCUMENTS

| | | | |
|---|---|---|---|
| 3,906,453 A * | 9/1975 | Mattedi et al. | 711/107 |
| 6,160,742 A * | 12/2000 | Chung et al. | 365/189.05 |
| 6,510,089 B2 | 1/2003 | Taura et al. | |
| 6,600,679 B2 * | 7/2003 | Tanzawa et al. | 365/189.11 |
| 7,274,603 B2 | 9/2007 | Futatsuyama et al. | |
| 7,397,297 B2 * | 7/2008 | Kimura | 327/333 |
| 2008/0036522 A1 * | 2/2008 | Chung et al. | 327/333 |
| 2009/0002027 A1 * | 1/2009 | Lee | 326/80 |

FOREIGN PATENT DOCUMENTS

KR 2006095611 A * 9/2006

* cited by examiner

*Primary Examiner* — Dang T Nguyen

(57) ABSTRACT

A level shifter includes a level shifter module that receives a first input signal having high and low states and at least one voltage supply signal, and that generates a latch control signal based on the high and low states of the first input signal. A latch module receives the latch control signal, a data input signal, and the at least one voltage supply signal. The latch module selectively stores data associated with the data input signal based on the latch control signal. The latch module selectively changes the at least one voltage supply signal from a first level to a second level and outputs the data according to the second level based on the latch control signal.

20 Claims, 12 Drawing Sheets

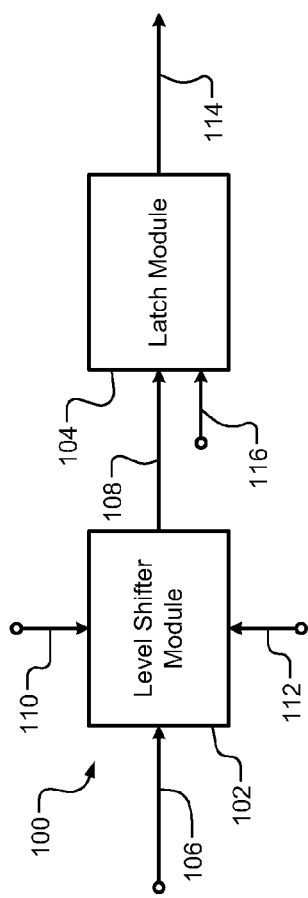
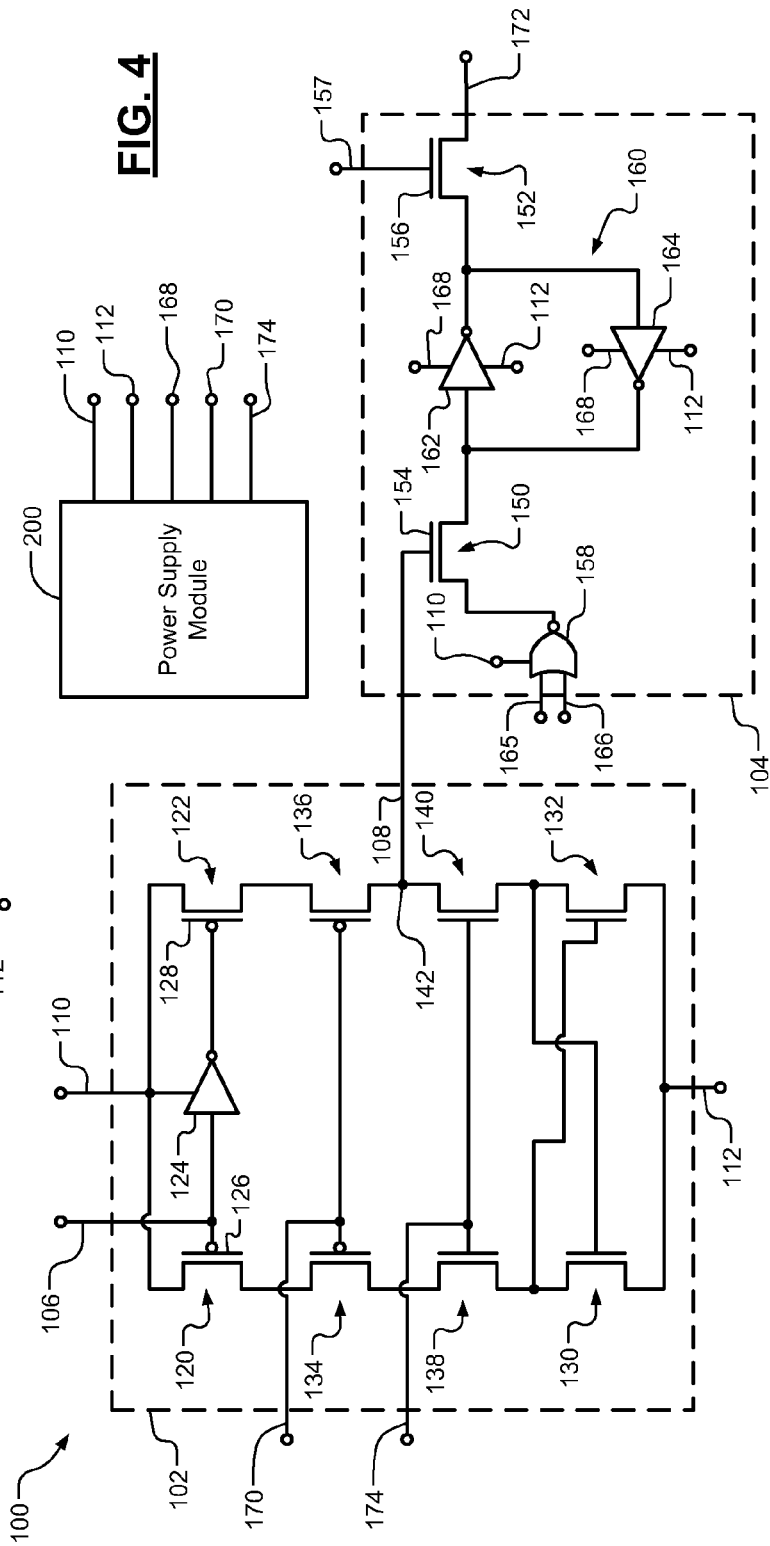

POSITIVE AND NEGATIVE VOLTAGE LEVEL SHIFTER CIRCUIT

CROSS-REFERENCE TO RELATED APPLICATIONS

This application claims the benefit of U.S. Provisional Application No. 60/980,017, filed on Oct. 15, 2007. The disclosure of the above application is incorporated herein by reference in its entirety.

FIELD

The present disclosure relates to level shifters, and more particularly to a level shifter having a greater output voltage range.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Referring now to FIG. 1, a level shifter 10 is shown. The level shifter 10 receives an input voltage Vin and generates an output voltage Vout. The level shifter 10 may include first and second NMOS transistors 12 and 14. A gate 16 of the first NMOS transistor 12 receives the input voltage Vin. An inverter 18 is connected between the gate 16 and a gate 20 of the second NMOS transistor 14. The level shifter 10 includes first and second PMOS transistors 22 and 24 connected in a flip-flop or half latch arrangement. In another configuration, the PMOS transistors 22 and 24 may receive the input voltage Vin and the NMOS transistors 12 and 14 may be connected in the flip-flop or half latch arrangement. In other words, the arrangement of the PMOS transistors 22 and 24 and the NMOS transistors 12 and 14 may be reversed.

Referring now to FIG. 2, a level shifter 30 may include first and second protection NMOS transistors 32 and 34 and first and second protection PMOS transistors 36 and 38. The first and second protection NMOS transistors 32 and 34 communicate with a first protection voltage Vprot1. Conversely, the first and second protection PMOS transistors 36 and 38 communicate with a second protection voltage Vprot2. The protection voltages Vprot1 and Vprot2 bias the protection NMOS transistors 32 and 34 and the protection PMOS transistors 36 and 38, respectively, to protect the level shifter 30 from excessive electric stress.

Referring now to FIGS. 1 and 2, the level shifters 10 and 30 communicate with input supply voltages Vss_in and Vdd_in and output supply voltages Vss_out and Vdd_out. Typically, the input supply voltage Vss_in is equivalent to the output supply voltage Vss_out, and the input supply voltage Vdd_in is not equivalent to the output supply voltage Vdd_out, although those skilled in the art can appreciate that the reverse is true when the positions of the NMOS transistors 12 and 14 and the PMOS transistors 22 and 24 are reversed.

The above described relationships between Vss_in and Vss_out and between Vdd_in and Vss_out may limit the operation of the level shifters 10 and 30. For example, in an NMOS driven level shifter, when Vss_out is greater than Vdd_in minus an NMOS threshold voltage Vt, the transistors 12 and 14 remain off regardless of whether a logical 0 or a logical 1 is applied to an input node. Consequently, the level shifters 10 and 30 will not function properly. Similarly, in a PMOS driven level shifter, when Vdd_out is less than Vss_in minus a negative PMOS threshold voltage Vt, the transistors 12 and 14 remain off. As a result, when an NMOS driven level shifter is used, an output low level needs to be equivalent to a logic low level (e.g. 0V, or a logical 0). Similarly, when a PMOS driven level shifter is used, an output high level needs to be equivalent to a logic high level (e.g. 3.3V, or a logical 1).

SUMMARY

A level shifter includes a level shifter module that receives a first input signal having high and low states and at least one voltage supply signal, and that generates a latch control signal based on the high and low states of the first input signal. A latch module receives the latch control signal, a data input signal, and the at least one voltage supply signal. The latch module selectively stores data associated with the data input signal based on the latch control signal. The latch module selectively changes the at least one voltage supply signal from a first level to a second level and outputs the data according to the second level based on the latch control signal.

In other features, the latch module selectively stores the data associated with the data input signal when the first input signal is in the high state, and selectively changes the at least one voltage supply signal from the first level to the second level and outputs the data when the first input signal is in the low state. The latch module receives at least one second voltage supply signal, changes the at least one second voltage supply signal from a third level to the first level when the first input signal is in the low state, and outputs the data according to the first level. The latch module outputs the data according to the first level when the first input signal is in the low state.

In other features, a power supply module generates the at least one voltage supply signal. The latch module includes a transistor that receives the latch control signal and that communicates the data based on the latch control signal. The latch module includes first and second inverters that receive the data based on the latch control signal. The latch module includes at least one logic gate that receives the data input signal and a data transfer signal and that outputs the data based on the data input signal and the data transfer signal. The latch module includes a first logic gate that receives the data input signal and a logic control signal, and that outputs the data based on the data input signal and the logic control signal. A second logic gate receives the data and a data transfer signal and outputs the data based on the data transfer signal. The logic control signal is based on the at least one voltage supply signal.

In other features, at least one second latch module receives the latch control signal, a second data input signal, and the at least one voltage supply signal, stores second data associated with the second data input signal when the first input signal is in the high state, changes the at least one voltage supply signal from the first level to the second level when the first input signal is in the low state, and outputs the second data according to the second level. The second latch module outputs the second data based on the second level when the first input signal is in the low state. A system includes the level shifter and memory that receives the data from the latch module.

A method for operating a level shifter includes receiving a first input signal having high and low states and at least one voltage supply signal at a level shifter, generating a latch control signal based on the high and low states of the first input signal at the level shifter, receiving the latch control signal, a data input signal, and the at least one voltage supply signal at a latch module, selectively storing data associated with the data input signal based on the latch control signal, and selectively changing the at least one voltage supply signal from a first level to a second level and outputting the data according to the second level based on the latch control signal.

In other features, the method further includes selectively storing the data associated with the data input signal when the first input signal is in the high state, and selectively changing the at least one voltage supply signal from the first level to the second level and outputting the data when the first input signal is in the low state. The method further includes receiving at least one second voltage supply signal, changing the at least one second voltage supply signal from a third level to the first level when the first input signal is in the low state, and outputting the data according to the first level. The method further includes outputting the data according to the first level when the first input signal is in the low state.

In other features, the method further includes providing first and second inverters and receiving the data at the first and second inverters based on the latch control signal. The method further includes providing at least one logic gate, receiving the data input signal and a data transfer signal at the at least one logic gate, and outputting the data from the at least one logic gate based on the data input signal and the data transfer signal. The method further includes providing a first logic gate that receives the data input signal and a logic control signal and that outputs the data based on the data input signal and the logic control signal, and providing a second logic gate that receives the data and a data transfer signal and that outputs the data based on the data transfer signal. The logic control signal is based on the at least one voltage supply signal.

In other features, the method further includes receiving the latch control signal, a second data input signal, and the at least one voltage supply signal at a second latch module, storing second data associated with the second data input signal when the first input signal is in the high state, changing the at least one voltage supply signal from the first level to the second level when the first input signal is in the low state, and outputting the second data according to the second level. The method further includes outputting the second data according to the second level when the first input signal is in the low state. The method further includes receiving the data from the latch module with at least one of volatile and nonvolatile memory.

A level shifter includes level shifter means for receiving a first input signal having high and low states and at least one voltage supply signal, and for generating a latch control signal based on the high and low states of the first input signal. The level shifter includes latch means for receiving the latch control signal, a data input signal, and the at least one voltage supply signal, for selectively storing data associated with the data input signal based on the latch control signal, and for selectively changing the at least one voltage supply signal from a first level to a second level and outputting the data according to the second level based on the latch control signal.

In other features, the latch means selectively stores the data associated with the data input signal when the first input signal is in the high state, and selectively changes the at least one voltage supply signal from the first level to the second level and outputs the data when the first input signal is in the low state. The latch means receives at least one second voltage supply signal, changes the at least one second voltage supply signal from a third level to the first level when the first input signal is in the low state, and outputs the data according to the first level. The latch means outputs the data according to the first level when the first input signal is in the low state.

In other features, the level shifter includes power supply means for generating the at least one voltage supply signal. The latch means includes a transistor that receives the latch control signal and that communicates the data based on the latch control signal. The latch means includes first and second inverters that receive the data based on the latch control signal. The latch means includes at least one logic gate that receives the data input signal and a data transfer signal and that outputs the data based on the data input signal and the data transfer signal. The latch means includes a first logic gate that receives the data input signal and a logic control signal, and that outputs the data based on the data input signal and the logic control signal. A second logic gate receives the data and a data transfer signal and outputs the data based on the data transfer signal. The logic control signal is based on the at least one voltage supply signal.

In other features, the level shifter includes at least one second latch means for receiving the latch control signal, a second data input signal, and the at least one voltage supply signal, for storing second data associated with the second data input signal when the first input signal is in the high state, for changing the at least one voltage supply signal from the first level to the second level when the first input signal is in the low state, and for outputting the second data according to the second level. The second latch means outputs the second data based on the second level when the first input signal is in the low state. A system includes the level shifter and memory means for receiving the data from the latch means.

Further areas of applicability of the present disclosure will become apparent from the detailed description, the claims and the drawings. It should be understood that the detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein:

FIG. 3 is a functional block diagram of a level shifter according to the present disclosure;

FIG. 4 illustrates the level shifter according to the present disclosure in further detail;

DESCRIPTION

Figure 2:
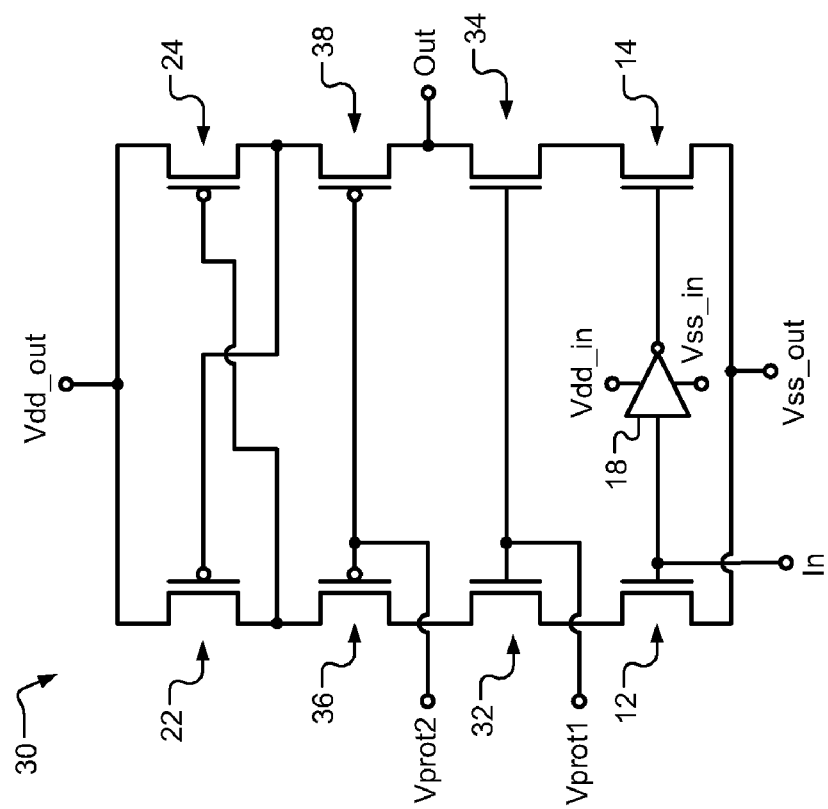
FIG. 2 illustrates a level shifter including protection transistors according to the prior art.
Figure 1:
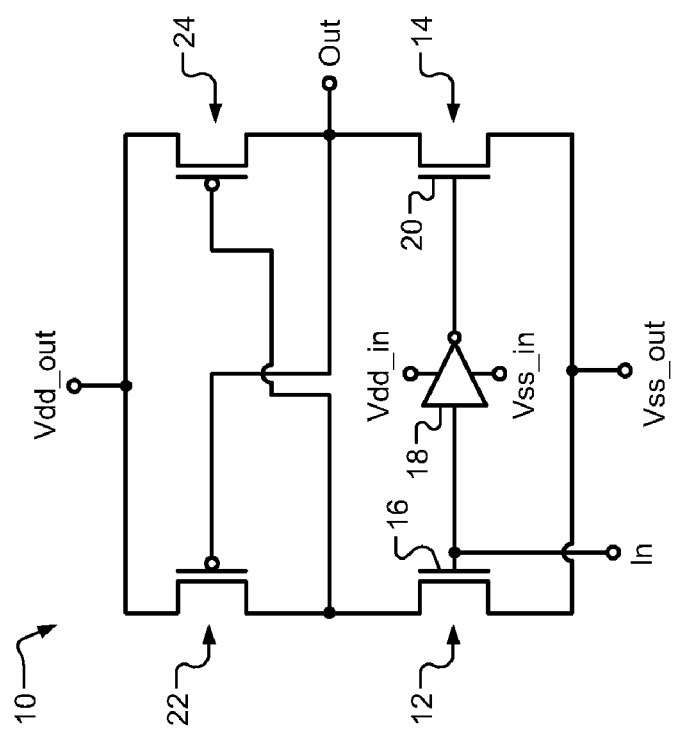
FIG. 1 illustrates a level shifter according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Typically, when an input to an NMOS level shifter varies between, for example only, 0 and 3.3V, an output of the level shifter may vary between 0 and X, where X is greater than an absolute value of a threshold voltage Vt. In other words, a minimum output low level may not be less than 0. Conversely, when an input to a PMOS level shifter varies between, for example only, 0 and 3.3V, an output of the level shifter may vary between X and 3.3V, where X is less than 3.3V minus a threshold voltage Vt. In other words, a maximum output high level may not be greater than 3.3V.

The level shifter circuit of the present disclosure allows for a broader range of output voltages for the same range of input voltages. For example, when the input to the level shifter varies between 0 and 3.3V, the output may vary between, for example only, X and Y, where X is less than a threshold voltage Vt and Y is greater than X plus the threshold voltage Vt. In other implementations, the output may vary between X and Y, where X is less than 3.3V plus a threshold voltage Vt, and Y is greater than X plus the threshold voltage Vt. Accordingly, neither the minimum nor maximum output levels are limited by the minimum input level of 0V and the maximum input level of 3.3V, respectively. For example, with a 3.3V device, the level shifter may shift anywhere between −3.3V and 3.3V for a total range of 6.6V.

Referring now to FIG. 3, a level shifter 100 according to the present disclosure is shown. The level shifter 100 includes a level shifter module 102 and a latch module 104. The level shifter module 102 receives an input signal 106. For example, the input signal 106 may vary between low and high levels (e.g. between 0 and 3.3V). The level shifter module 102 generates a latch control signal 108 based on the input signal 106 and first and second supply signals 110 and 112. For example, when the input signal 106 is high (e.g. 3.3V), the latch control signal 108 is high. When high, the value of the latch control signal 108 may be based on the first supply signal 110. For example only, the first supply signal 110 may be 3.3V (i.e. the same as the high level of the input signal 106).

Conversely, when the input signal 106 is low (e.g. 0V), the latch control signal 108 is low. When low, the value of the latch control signal 108 may be based on the second supply signal 112. The second supply signal 112 may vary between 0V (i.e. the same as the low level of the input signal 106) and −3.3V. Accordingly, the low value of the latch control signal 108 may transition between 0V and −3.3V based on the second supply signal 112.

The latch module 104 generates an output signal 114 based on the latch control signal 108 and a logic input signal 116 The output signal 114 is not limited to a range of 0V to 3.3V. For example, the output signal 114 may transition to a range between −3.3V and 0V Referring now to FIG. 4, the level shifter module 102 includes first and second PMOS transistors 120 and 122. A gate 126 of the first PMOS transistor receives the input signal 106. An inverter 124 is connected between the gate 126 of the first PMOS transistor 120 and a gate 128 of the second PMOS transistor 122. The inverter 124 drives the gate 128 of the second PMOS transistor 122. Each of the PMOS transistors 120 and 122 communicate with the first supply signal 110.

The level shifter module 102 includes first and second NMOS transistors 130 and 132 connected in a flip-flop or half latch arrangement. Each of the transistors 130 and 132 communicate with the second supply signal 112. First and second protection PMOS transistors 134 and 136 and first and second protection NMOS transistors 138 and 140 are connected in a cascade arrangement. Output node 142 generates the latch control signal 108 based on the input signal 106 and the first and second supply signals 110 and 112. For example, the latch control signal 108 may be either high (e.g. 3.3V) or low (e.g. 0 or −3.3V) based on a logic high or low level of the input signal 106.

The latch module 104 includes NMOS transistors 150 and 152. A gate 154 of the NMOS transistor 150 receives the latch control signal 108. Accordingly, the NMOS transistor 150 is on or off based on the latch control signal 108. A gate 156 of the NMOS transistor 152 receives a second latch control signal 157. Accordingly, the NMOS transistor 152 is on or off based on the second latch control signal 157. The NMOS transistor 150 passes an output of a logic gate 158 to a latch 160 that includes inverters 162 and 164 based on the latch control signal 108. Accordingly, the output of the logic gate 158 (e.g. a logical NOR gate) controls an input to the latch 160. The logic gate 158 receives a logic input signal 165 and a data transfer signal 166. A body (i.e. substrate) of each of the NMOS transistors 150 and 152 may be connected to the second supply signal 112 to prevent parasitic PN junctions (not shown).

The inverters 162 and 164 receive the second supply signal 112 and a third supply signal 168 (e.g. at 3.3V). The logic gate 158 may receive the first supply signal 110 as a positive supply signal. Although not shown, each of the logic gate 158 and the inverter 124 may receive a fourth supply signal (such as $V_{SS}$) 170 as a ground supply signal. For example only, the first supply signal 110 and the fourth supply signal 170 may be equivalent to other logic circuits in an integrated circuit (IC) or system on a chip (SOC) that includes the level shifter 100.

The latch module 104 generates an output signal 172 based on the logic state of the logic input signal 165. For example, the output signal 172 may be based on one of the second supply signal 112 and the third supply signal 168 based on transitions of the logic input signal 165 between low and high states.

Although the second and third supply signals 112 and 168 are given as, for example, 0V and 3.3V, respectively, any voltage can be used as long as the third supply signal 168 is greater than the second supply signal 112 and the latch 160 is functional. For example, the third supply signal 168 may be 0V when the second supply signal 112 is −3.3V. Accordingly, output levels of the level shifter 100 may shift according to the level of the second supply signal 112. In other words, in a high voltage operation mode, the level shifter 100 may shift between 0V and 3.3V. In a low voltage operation mode, the level shifter 100 may shift between −3.3V and 3.3V. Transistors 130 and 132 may receive a protection voltage signal 174.

The level shifter 100 may include a power supply module 200. The power supply module 200 generates the first, second, third, and fourth supply signals 110, 112, 168, and 170, respectively, and the protection voltage signal 174 according to desired operating conditions of the level shifter 100.

Initially, the third supply signal 168 may be equivalent to the first supply signal 110 (e.g. 3.3V) and the fourth supply signal 170 may be equivalent to the second supply signal 112 (e.g. 0V). To pass data from the input logic signal 165 to the latch 160, the input signal 106 is set high (e.g. 3.3V). For example, a high level at the input signal 106 may correspond to a command to write data from the input logic signal 165 to memory (not shown). The data transfer signal 166 is set low (e.g. to logical 0). Accordingly, the output of the logic gate 158 will be controlled according to the input logic signal 165. Further, a polarity of the latch 160 will be set according to the input logic signal 165 passed by the NMOS transistor 150.

When the value of the input logic signal 165 is set in the latch 160, the input signal 106 transitions to a low level, applying the value of the second supply signal 112 and therefore turning off the NMOS transistor 150. The data transfer signal 166 is set high (e.g. to logical 1), transitioning the output of the logic gate 158 to low. For example, since the ground supply signal of the logic gate 158 is the fourth supply signal 170, the low output level of the logic gate 158 may correspond to the fourth supply signal 170 (e.g. ground or 0V).

With the NMOS transistor 150 turned off, the power supply module 200 may change the voltages of the second and third supply signals 112 and 168. For example, the power supply module 200 may change the second and third supply signals 112 and 168 from 0V and 3.3V to −3.3V and 0V, respectively (i.e. shift between a high voltage operation mode to a low voltage operation mode). When the second and third supply signals 112 and 168 are changed, the NMOS transistor 152 is turned on (e.g. via transitioning the second latch control signal 157 to a suitable voltage). When the NMOS transistor 152 is on, the selected output voltage of one of the second and third supply signals 112 and 168 is output as the output signal 172. For example, when the input logic signal 165 is high, the output signal 172 is high (e.g. 0V or 3.3V). When the input logic signal 165 is low, the output signal 172 is low (e.g. −3.3V or 0V).

Shifting various input voltages may protect devices in the level shifter such as the NMOS transistors 130, 132, and 150. For example, if the NMOS transistor 150 is a 3.3V device, a gate voltage of 3.3V with a source/drain voltage of −3.3V may cause undue stress on the NMOS transistor 150. Accordingly, the output of the logic gate 158 may be shifted to 0V in this situation to prevent a larger voltage across the NMOS transistor 150. Similarly, the protection voltage signal 174 received at the NMOS transistors 138 and 140 may be changed to the level of the fourth supply signal 170 (e.g. 0V or ground) when the second supply signal 112 is changed to a lower level such as −3.3V. Accordingly, second and third supply signals 112 and 168 may have any voltage value as long as their difference does not introduce excessive stress on the transistors, their difference is large enough to keep the latch 160 set, and the NMOS transistor 150 remains off during level shifting.

In certain operating conditions of the level shifter 100 shown in FIG. 4, the NMOS transistor 150 may inadvertently be turned on. For example, when the output of the logic gate 158 is 0V and the second supply signal 112 is greater than 0V plus an NMOS threshold voltage Vt, the NMOS transistor 150 may turn on. Similarly, when the output of the logic gate 158 is 0V and the second supply signal 112 is greater than 0V plus a PN diode voltage, a parasitic PN junction diode between a body and a source of the NMOS transistor 150 may turn on. Accordingly, the second supply signal 112 may still be limited.

Figure 5:
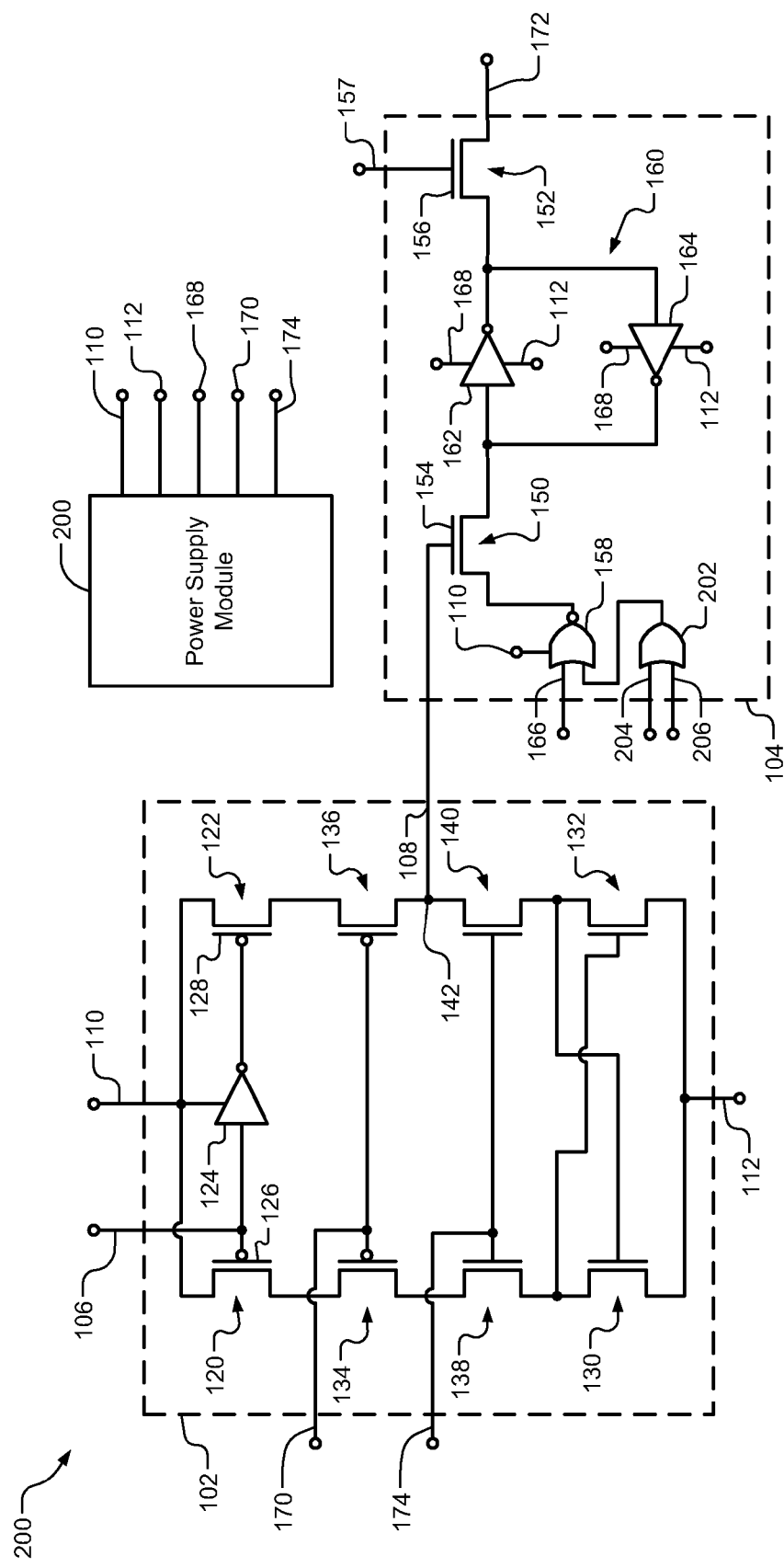
FIG. 5 illustrates a second level shifter according to the present disclosure.

Referring now to FIG. 5, a level shifter 200 includes the logic gate 158 and a logic gate 202. The logic gate 202 receives an inverted input logic signal 204 and a logic control signal 206. The logic gate 158 receives an output of the logic gate 202 and the data transfer signal 166. When the second supply signal 112 is less than or equal to 0V (i.e. not positive), the logic control signal 206 is low (i.e. logical 0) and the level shifter 200 operates analogously to the level shifter 100 shown in FIG. 4.

When the second supply signal 112 is greater than 0V (i.e. positive), the logic control signal 206 is high (i.e. logical 1) and the data transfer signal 166 is low (i.e. logical 0). Accordingly, in this circumstance, the output of the logic gate 158 is forced high (i.e. to 3.3V), thereby ensuring that the NMOS transistor 150 remains off even when the second supply signal 112 is positive. In other words, the output of the logic gate 158 as shown in FIG. 5 may be low (e.g. 0V) or high (e.g. 3.3V) based on whether the second supply signal 112 is negative or positive.

Figure 6:
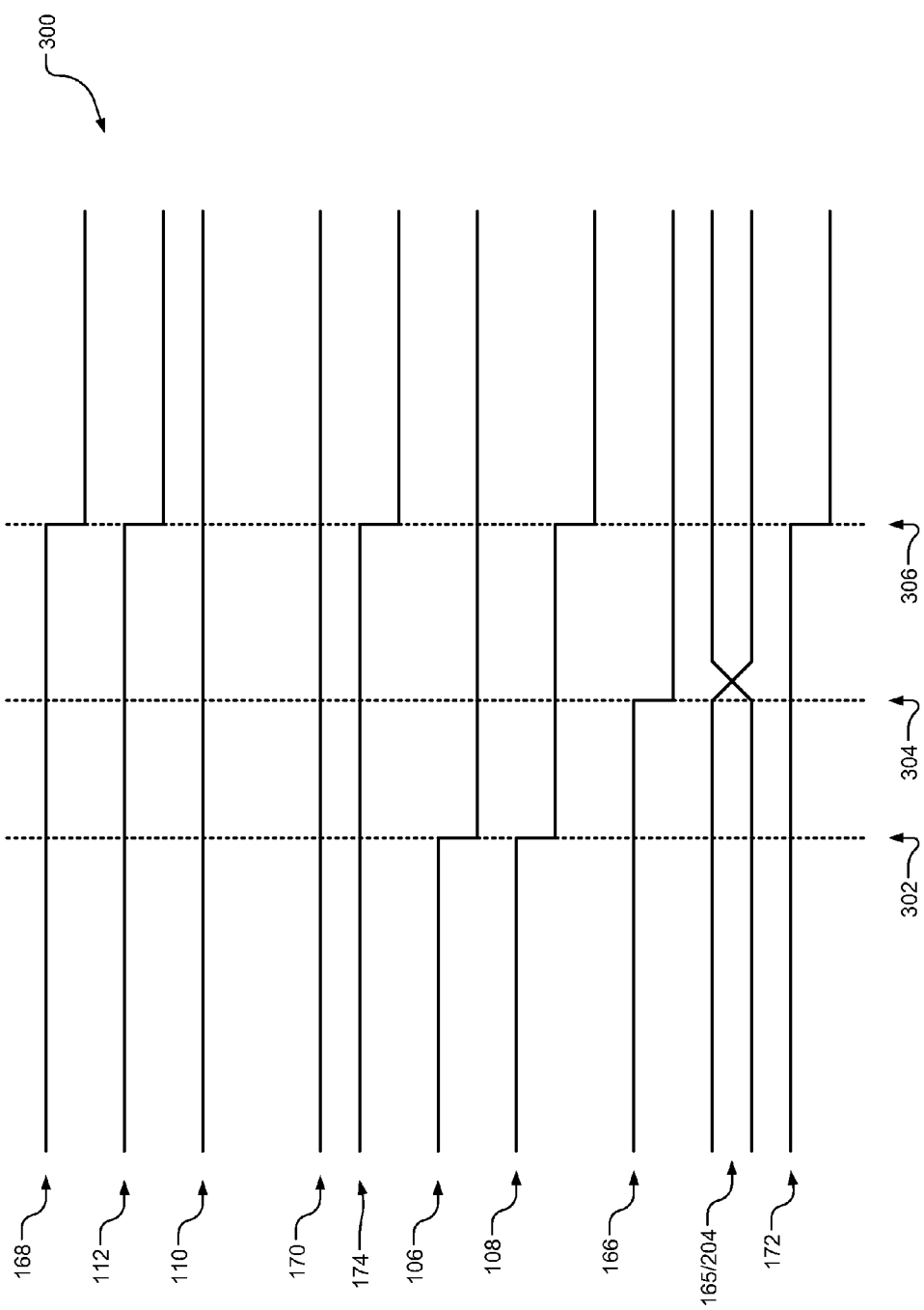
FIG. 6 illustrates a signal timing diagram of the level shifter according to the present disclosure.

Referring now to FIG. 6, a timing diagram 300 for the various signals described in FIGS. 3-5 is shown. The output signal 172 follows one of the input logic signal 165 and the inverted input logic signal 204 for FIGS. 4 and 5, respectively. When the input signal 106 is high, none of the values of the supply signals are changed and the value of the input logic signal 165 (or the inverted input logic signal 204) is set in the latch 160. When the input signal 106 is low, the latch control signal 108 transitions low to turn off the NMOS transistor 150 as indicated at 302. At 304, the data transfer signal 166 transitions low to ensure that the NMOS transistor 150 remains off during level shifting.

At 306, the second supply signal 112 is shifted from 0V to −3.3V. The third supply signal 168 is shifted from 3.3V to 0V. The protection voltage signal 174 may be shifted from 3.3V to 0V to reduce stress on certain devices. The first supply signal 110 and the fourth supply signal 170 remain high (e.g. 3.3V) and low (e.g. ground or 0V), respectively.

Figure 7:
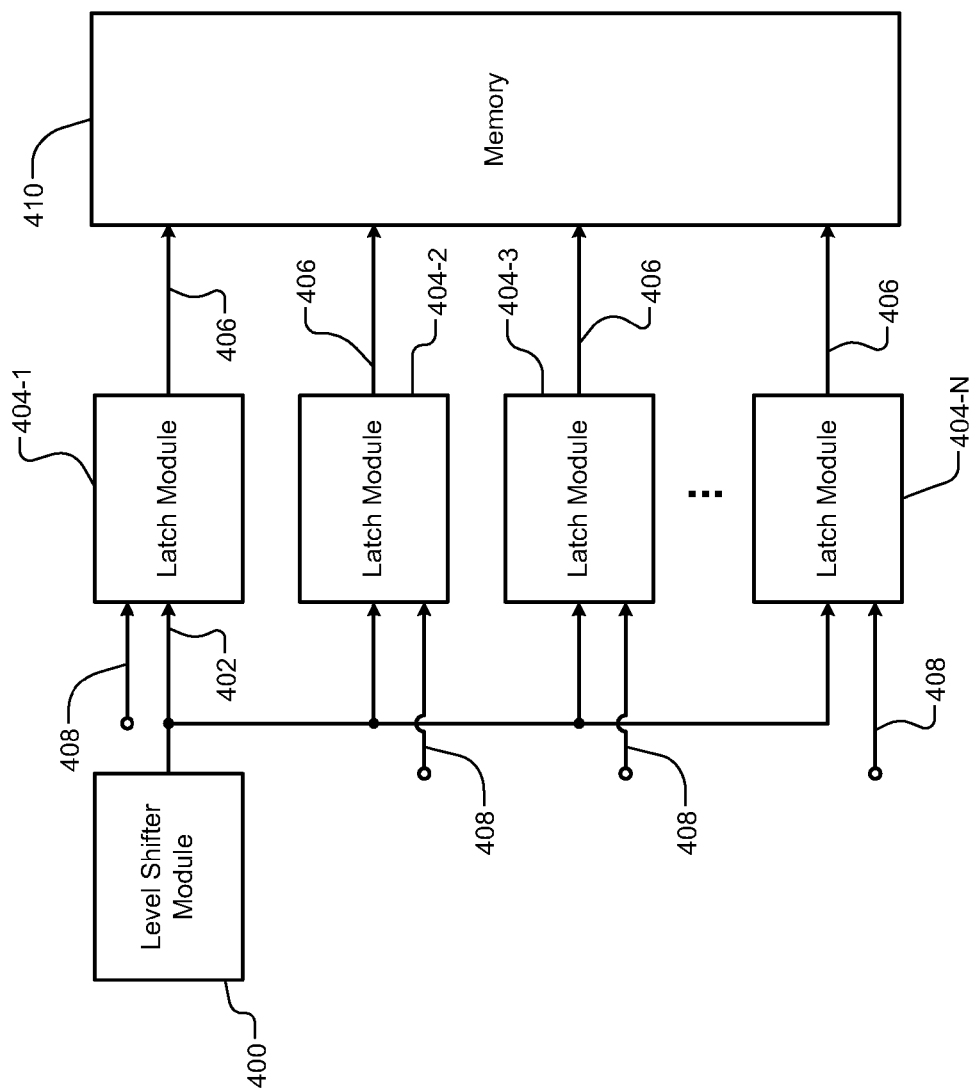
FIG. 7 illustrates a level shifter including multiple latch modules according to the present disclosure.

Referring now to FIG. 7, a level shifter module 400 may provide a latch control signal 402 to multiple latch modules 404-1, 404-2, 404-3, ..., and 404-N (referred to collectively as latch modules 404). Each of the latch modules 404 may generate a different output signal 406 based on respective input signals 408. The latch modules 404 may input data based on the output signals 406 according to the level shifting operation as described in FIGS. 3-6. For example, each of the latch modules 404 may input data to an input line of memory 410 (which may include, for example only, a memory IC). Alternatively, a single one of the latch modules 404 may be implemented with multiplexing to input data to multiple lines of the memory 410. For example only, the memory 410 may include nonvolatile memory.

Figure 8:
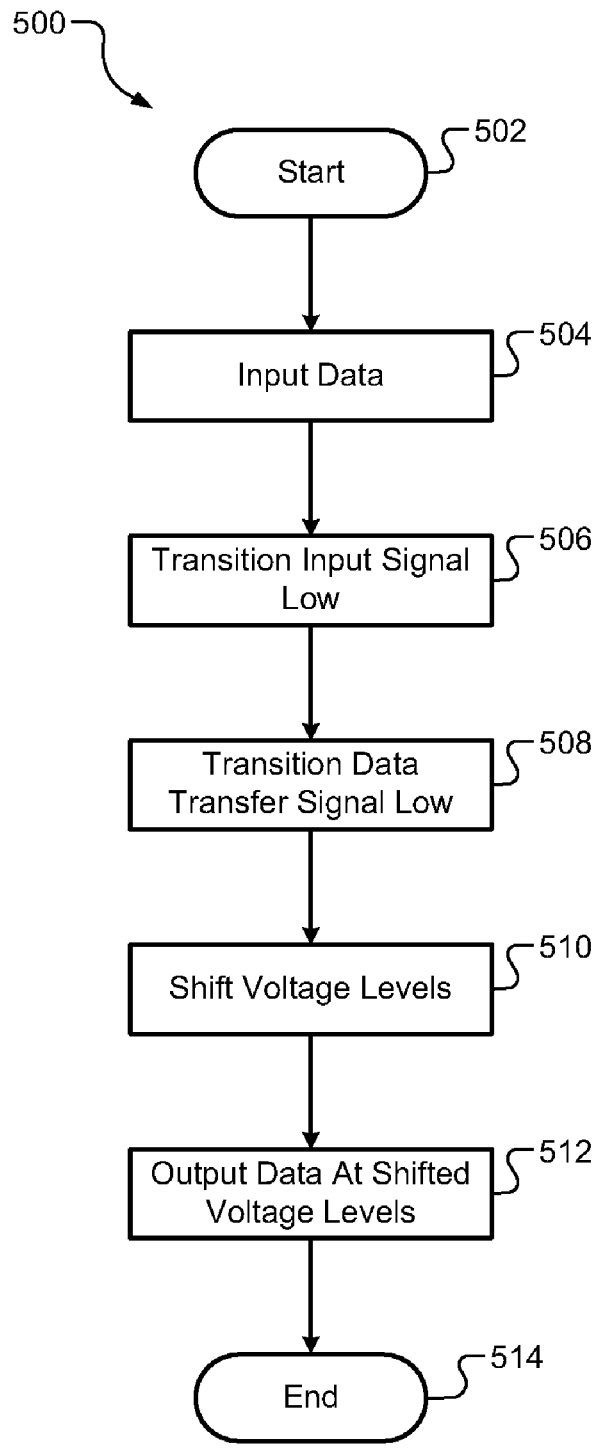
FIG. 8 illustrates steps of a method for operating a level shifter according to the present disclosure.

Referring now to FIG. 8, a method 500 for operating a level shifter having a level shifter module 102 and a latch module 104 according to the present disclosure begins in step 502. In step 504, data is input to the latch module 104 with supply voltages at a first level. In step 506, an input signal to the level shifter module 102 transitions low. In step 508, a data transfer signal input to the latch module 104 transitions low to set the data in the latch module 104. In step 510, levels of supply signals to the level shifter module 102 and the latch module 104 are shifted between high and low operation voltages. In step 512, the data is output from the latch module 104 according to the new operation voltages. The method 500 ends in step 514.

Referring now to FIGS. 9A-9H, various exemplary implementations incorporating the teachings of the present disclosure are shown.

Figure 9A:
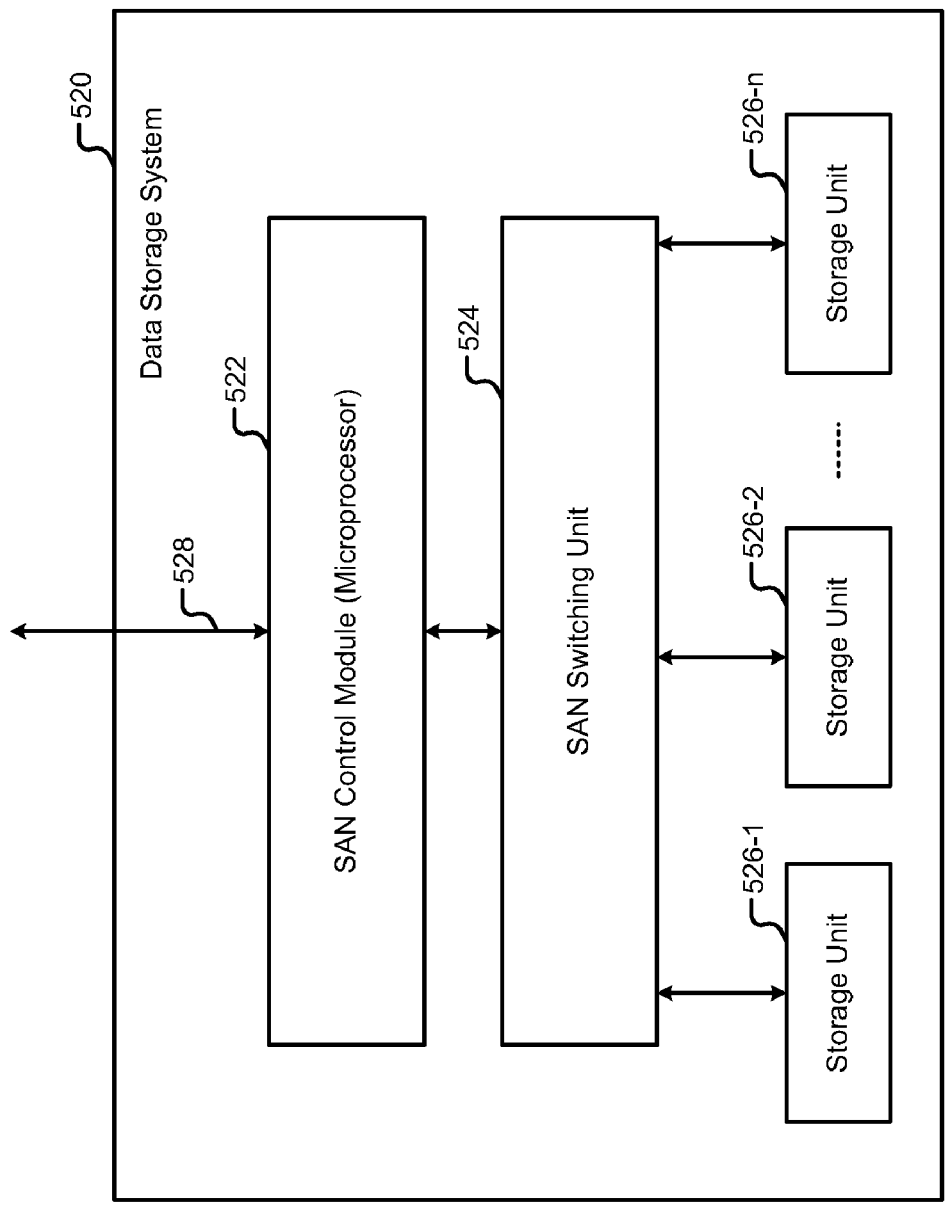
FIG. 9A is a functional block diagram of a data storage system including storage units according to the present disclosure.
Figure 9B:
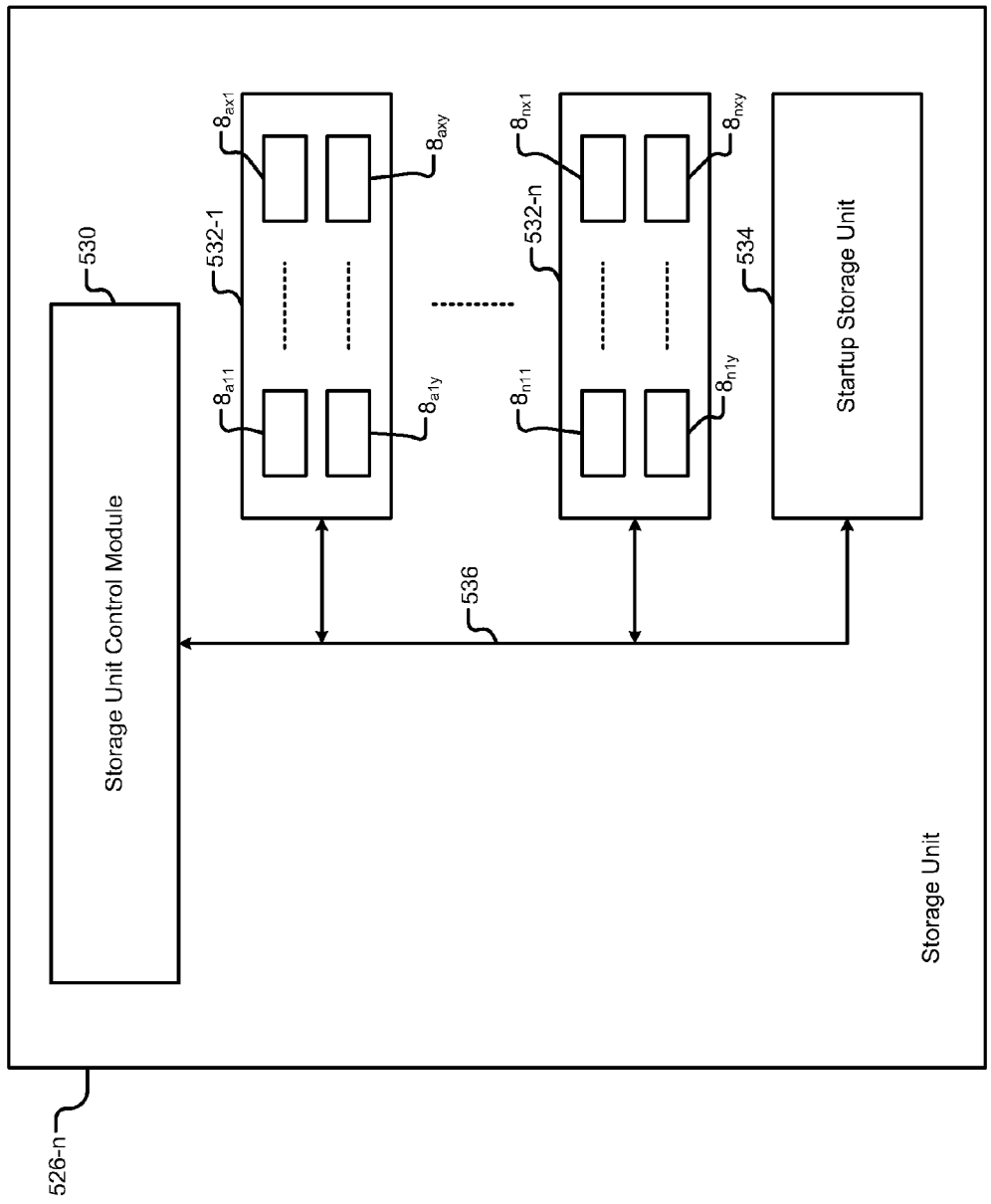
FIG. 9B is a functional block diagram of a storage unit of the data storage system of FIG. 9A according to the present disclosure.

Referring now to FIGS. 9A and 9B, the teachings of the present disclosure can be extended to storage products including data storage systems and solid-state disks. The architecture and configuration of the data storage system shown in FIGS. 9A and 9B are exemplary. Other architectures and device configurations are contemplated.

In FIG. 9A, for example only, a data storage system 520 may comprise a storage area network (SAN) control module 522, a SAN switching unit 524, and storage units 526-1, 526-2, . . . , and 526-n (collectively storage units 526). The SAN control module 522 may comprise a control unit that interfaces the data storage system 520 to one or more external devices (not shown) through an input/output (I/O) bus 528. For example, the control unit may include a processor, a microprocessor, an ASIC, a state machine, etc. For example, the external devices may include a host, a server, etc. The I/O bus 528 may comprise a bus that provides high speed and wide bandwidth for data transmission. For example, the I/O bus 528 may include fiber-channels, Ethernet, etc. For example only, the transmission speed of the I/O bus 528 may be faster than 10 gigabits per second (10 Gb/s).

Additionally, the SAN control module 522 may control the SAN switching unit 524. For example only, the SAN switching unit 524 may include a plurality of switches. Each of the switches may interface with one of the storage units 526 and may be controlled via control signals from the SAN control module 522. The storage units 526 may store information that includes audio data, video data, and/or any other types of data in a digital format.

In FIG. 9B, for example only, one of the storage units 526 (e.g., the storage unit 526-n) may comprise a storage unit control module 530, solid-state drives (SSDs) 532-1, . . . , and 532-n (collectively SSDs 532), a startup storage unit 534, and a bus 536. An SSD may refer to a data storage device that uses solid state memory to store data, such as a flash memory drive. Each of the SSDs 532 may comprise one or more of the memory 410 of FIG. 7, shown as memory ICs $410_{a11}$-$410_{nxy}$. The variables a and n refer to the SSD. The variables x and y refer to a memory IC within a SSD. The variable a may be equal to 1 and the variables n, x, and y may be integers greater than 1. Additionally, each of the SSDs 532 may comprise a memory controller (not shown) that controls the one or more of the memory ICs $410_{a11}$-$410_{nxy}$. The startup storage unit 534 may include code for operating the storage unit control module 530. Using the code, the storage unit control module 530 may control the SSDs 532 via the bus 536.

Figure 9C:
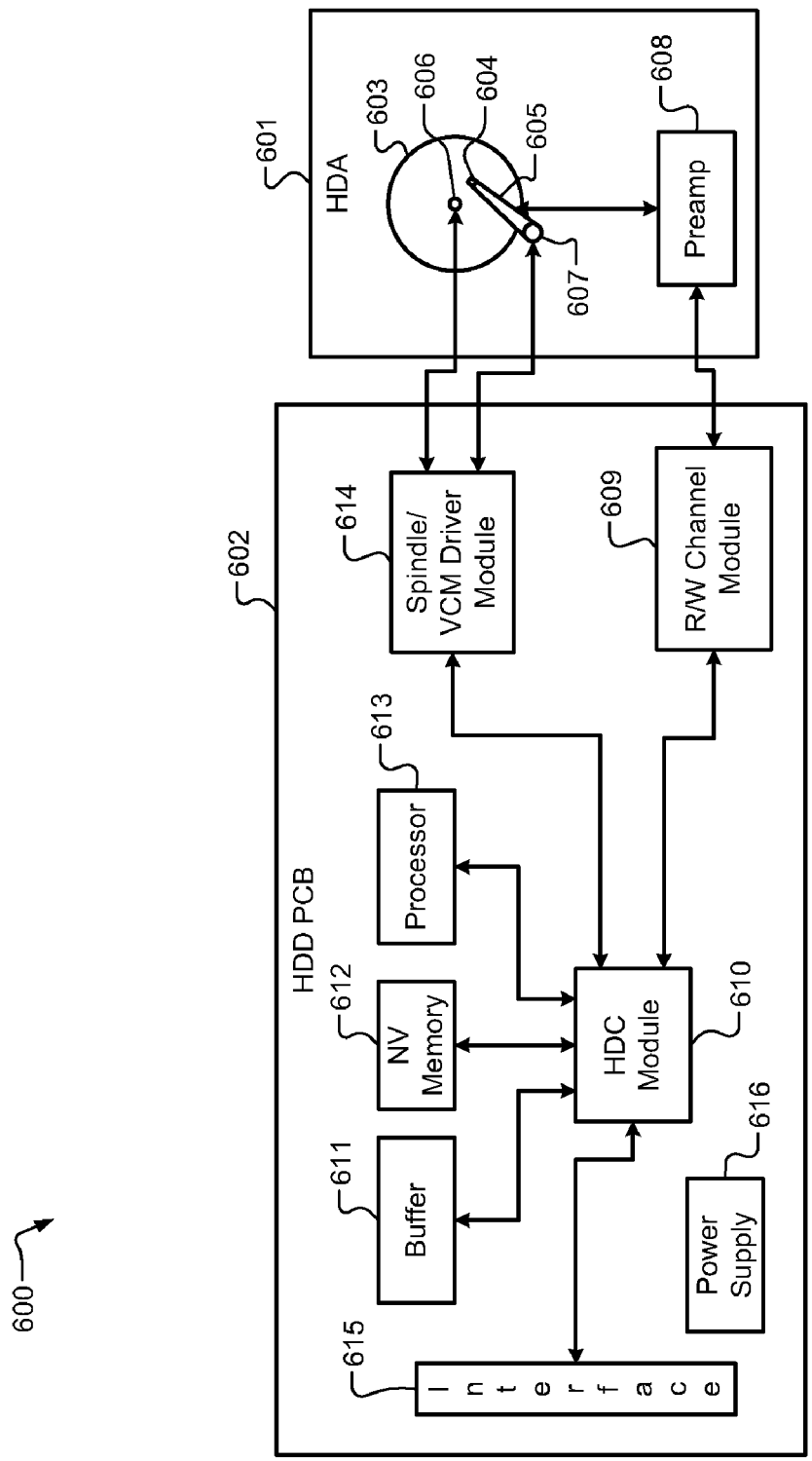
FIG. 9C is a functional block diagram of a hard disk drive.

Referring now to FIG. 9C, the teachings of the disclosure can be implemented in memory 612 of a hard disk drive (HDD) 600. The HDD 600 includes a hard disk assembly (HDA) 601 and an HDD printed circuit board (PCB) 602. The HDA 601 may include a magnetic medium 603, such as one or more platters that store data, and a read/write device 604. The read/write device 604 may be arranged on an actuator arm 605 and may read and write data on the magnetic medium 603. Additionally, the HDA 601 includes a spindle motor 606 that rotates the magnetic medium 603 and a voice-coil motor (VCM) 607 that actuates the actuator arm 605. A preamplifier device 608 amplifies signals generated by the read/write device 604 during read operations and provides signals to the read/write device 604 during write operations.

The HDD PCB 602 includes a read/write channel module (hereinafter, "read channel") 609, a hard disk controller (HDC) module 610, a buffer 611, memory 612, a processor 613, and a spindle/VCM driver module 614. The read channel 609 processes data received from and transmitted to the preamplifier device 608. The HDC module 610 controls components of the HDA 601 and communicates with an external device (not shown) via an I/O interface 615. The external device may include a computer, a multimedia device, a mobile computing device, etc. The I/O interface 615 may include wireline and/or wireless communication links.

The HDC module 610 may receive data from the HDA 601, the read channel 609, the buffer 611, memory 612, the processor 613, the spindle/VCM driver module 614, and/or the I/O interface 615. The processor 613 may process the data, including encoding, decoding, filtering, and/or formatting. The processed data may be output to the HDA 601, the read channel 609, the buffer 611, nonvolatile memory 612, the processor 613, the spindle/VCM driver module 614, and/or the I/O interface 615.

The HDC module 610 may use the buffer 611 and/or nonvolatile memory 612 to store data related to the control and operation of the HDD 600. The buffer 611 may include DRAM, SDRAM, etc. Memory 612 may include RAM or any suitable type of semiconductor or solid-state memory, such as flash memory (including NAND and NOR flash memory), phase change memory, magnetic RAM, and multi-state memory, in which each memory cell has more than two states. The spindle/VCM driver module 614 controls the spindle motor 606 and the VCM 607. The HDD PCB 602 includes a power supply 616 that provides power to the components of the HDD 600.

Figure 9D:
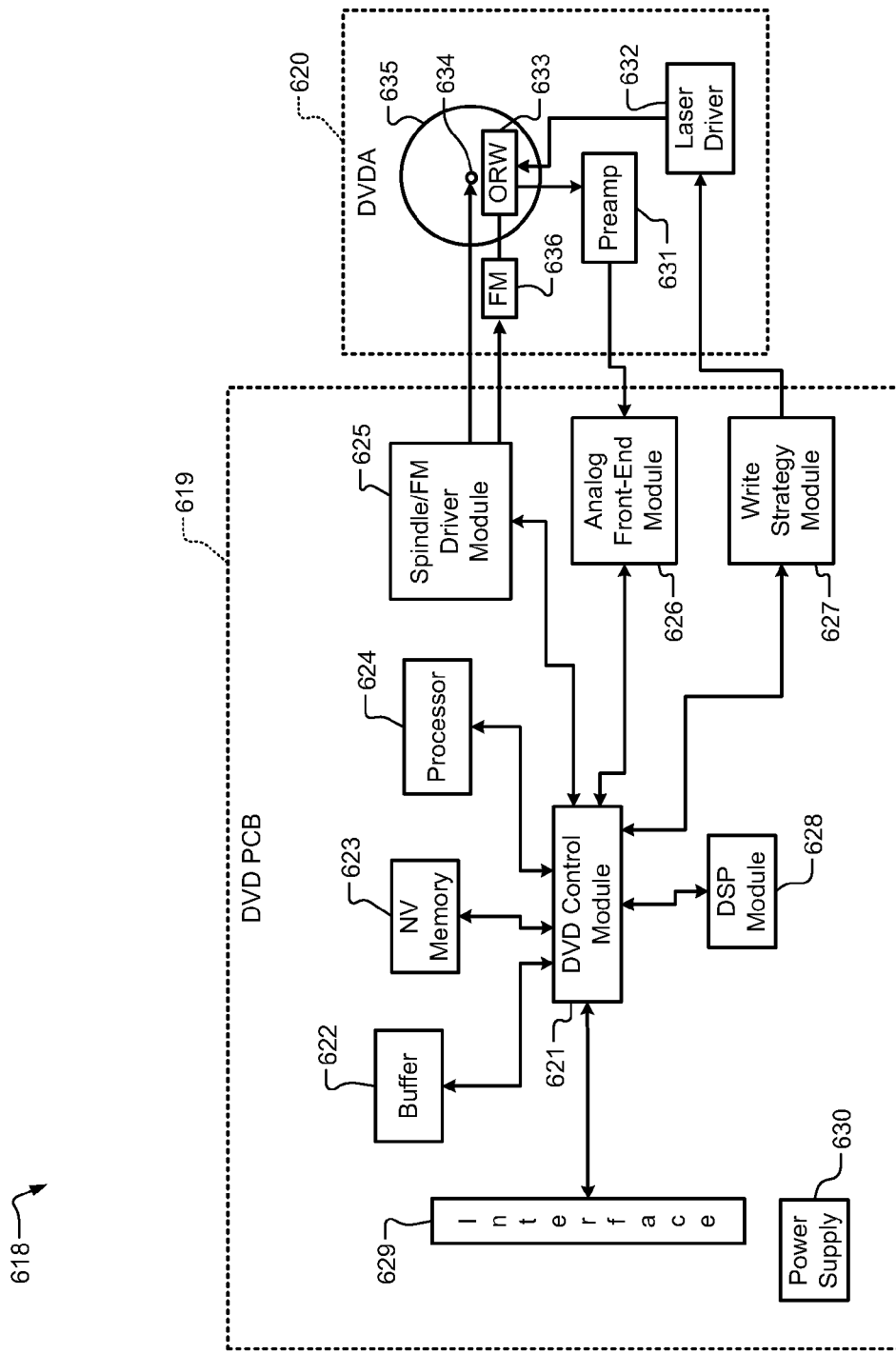
FIG. 9D is a functional block diagram of a DVD drive.

Referring now to FIG. 9D, the teachings of the disclosure can be implemented in memory 623 of a DVD drive 618 or of a CD drive (not shown). The DVD drive 618 includes a DVD PCB 619 and a DVD assembly (DVDA) 620. The DVD PCB 619 includes a DVD control module 621, a buffer 622, memory 623, a processor 624, a spindle/FM (feed motor) driver module 625, an analog front-end module 626, a write strategy module 627, and a DSP module 628.

The DVD control module 621 controls components of the DVDA 620 and communicates with an external device (not shown) via an I/O interface 629. The external device may include a computer, a multimedia device, a mobile computing device, etc. The I/O interface 629 may include wireline and/or wireless communication links.

The DVD control module 621 may receive data from the buffer 622, memory 623, the processor 624, the spindle/FM driver module 625, the analog front-end module 626, the write strategy module 627, the DSP module 628, and/or the I/O interface 629. The processor 624 may process the data, including encoding, decoding, filtering, and/or formatting. The DSP module 628 performs signal processing, such as video and/or audio coding/decoding. The processed data may be output to the buffer 622, memory 623, the processor 624, the spindle/FM driver module 625, the analog front-end module 626, the write strategy module 627, the DSP module 628, and/or the I/O interface 629.

The DVD control module 621 may use the buffer 622 and/or memory 623 to store data related to the control and operation of the DVD drive 618. The buffer 622 may include DRAM, SDRAM, etc. Memory 623 may include RAM or any suitable type of semiconductor or solid-state memory, such as flash memory (including NAND and NOR flash memory), phase change memory, magnetic RAM, and multi-state memory, in which each memory cell has more than two states. The DVD PCB 619 includes a power supply 630 that provides power to the components of the DVD drive 618.

The DVDA 620 may include a preamplifier device 631, a laser driver 632, and an optical device 633, which may be an optical read/write (ORW) device or an optical read-only (OR) device. A spindle motor 634 rotates an optical storage medium 635, and a feed motor 636 actuates the optical device 633 relative to the optical storage medium 635.

When reading data from the optical storage medium 635, the laser driver provides a read power to the optical device 633. The optical device 633 detects data from the optical storage medium 635, and transmits the data to the preamplifier device 631. The analog front-end module 626 receives data from the preamplifier device 631 and performs such functions as filtering and ND conversion. To write to the optical storage medium 635, the write strategy module 627 transmits power level and timing data to the laser driver 632. The laser driver 632 controls the optical device 633 to write data to the optical storage medium 635.

Figure 9F:
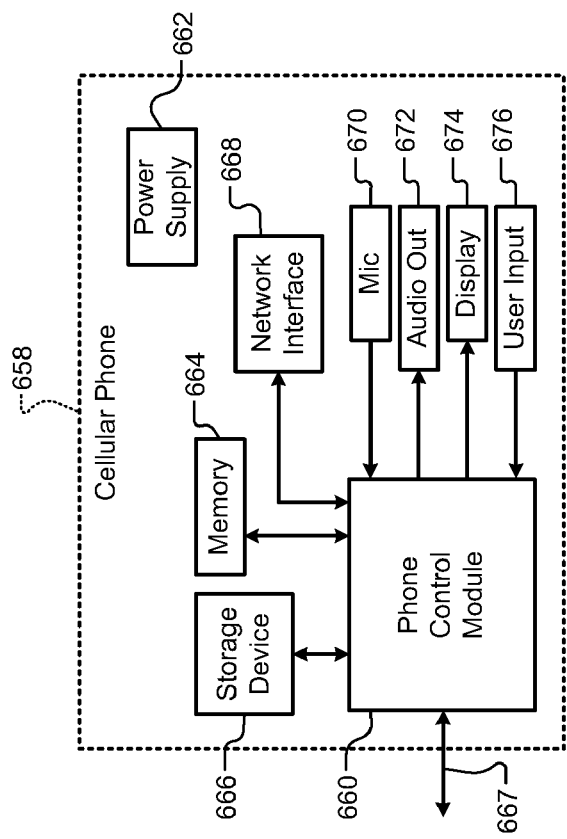
FIG. 9F is a functional block diagram of a cellular phone.
Figure 9E:
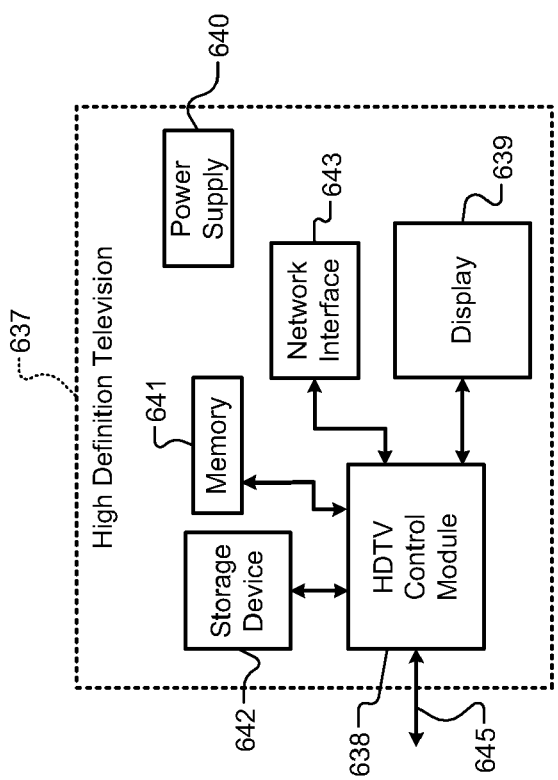
FIG. 9E is a functional block diagram of a high definition television.

Referring now to FIG. 9E, the teachings of the disclosure can be implemented in memory 641 of a high definition television (HDTV) 637. The HDTV 637 includes an HDTV control module 638, a display 639, a power supply 640, memory 641, a storage device 642, a network interface 643, and an external interface 645. If the network interface 643 includes a wireless local area network interface, an antenna (not shown) may be included.

The HDTV 637 can receive input signals from the network interface 643 and/or the external interface 645, which can send and receive data via cable, broadband Internet, and/or satellite. The HDTV control module 638 may process the input signals, including encoding, decoding, filtering, and/or formatting, and generate output signals. The output signals may be communicated to one or more of the display 639, memory 641, the storage device 642, the network interface 643, and the external interface 645.

Memory 641 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 642 may include an optical storage drive, such as a DVD drive, and/or a hard disk drive (HDD). The HDTV control module 638 communicates externally via the network interface 643 and/or the external interface 645. The power supply 640 provides power to the components of the HDTV 637.

Referring now to FIG. 9F, the teachings of the disclosure can be implemented in memory 664 of a cellular phone 658. The cellular phone 658 includes a phone control module 660, a power supply 662, memory 664, a storage device 666, and a cellular network interface 667. The cellular phone 658 may include a network interface 668, a microphone 670, an audio output 672 such as a speaker and/or output jack, a display 674, and a user input device 676 such as a keypad and/or pointing device. If the network interface 668 includes a wireless local area network interface, an antenna (not shown) may be included.

The phone control module 660 may receive input signals from the cellular network interface 667, the network interface 668, the microphone 670, and/or the user input device 676. The phone control module 660 may process signals, including encoding, decoding, filtering, and/or formatting, and generate output signals. The output signals may be communicated to one or more of memory 664, the storage device 666, the cellular network interface 667, the network interface 668, and the audio output 672.

Memory 664 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 666 may include an optical storage drive, such as a DVD drive, and/or a hard disk drive (HDD). The power supply 662 provides power to the components of the cellular phone 658.

Figure 9H:
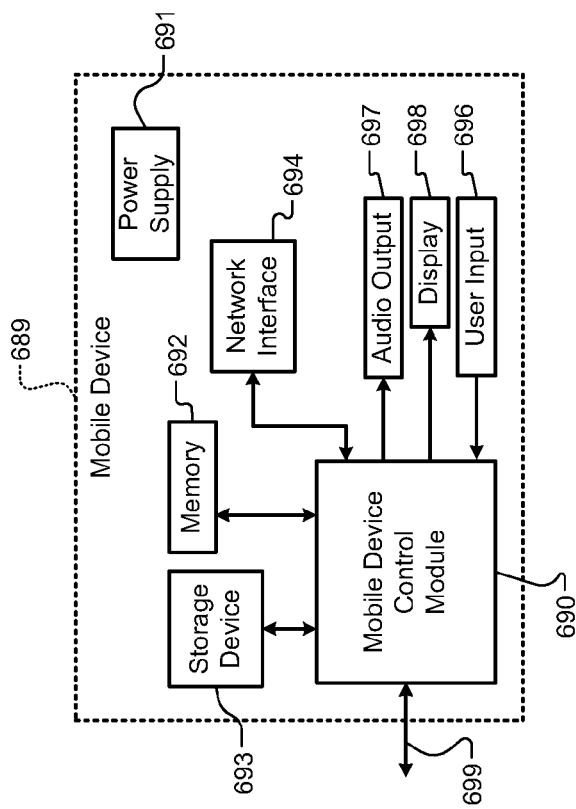
FIG. 9H is a functional block diagram of a mobile device.
Figure 9G:
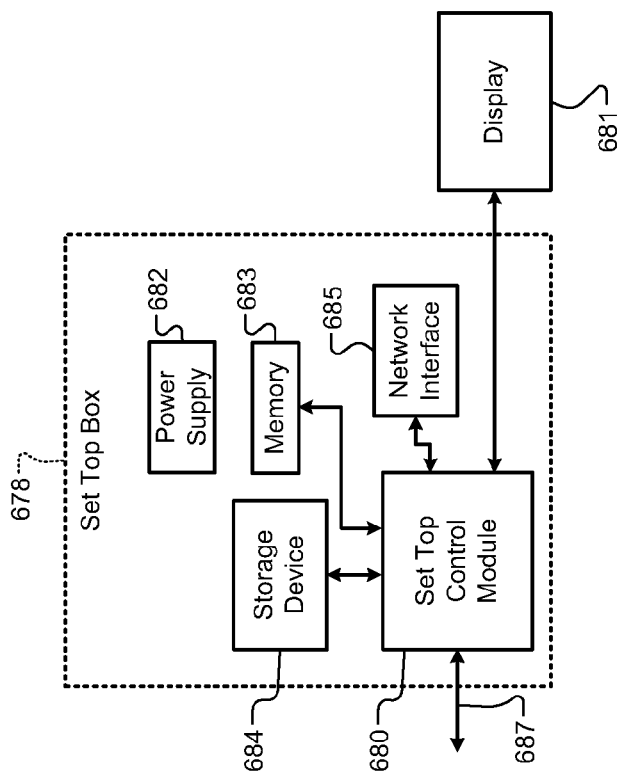
FIG. 9G is a functional block diagram of a set top box.

Referring now to FIG. 9G, the teachings of the disclosure can be implemented in memory 683 of a set top box 678. The set top box 678 includes a set top control module 680, a display 681, a power supply 682, memory 683, a storage device 684, and a network interface 685. If the network interface 685 includes a wireless local area network interface, an antenna (not shown) may be included.

The set top control module 680 may receive input signals from the network interface 685 and an external interface 687, which can send and receive data via cable, broadband Internet, and/or satellite. The set top control module 680 may process signals, including encoding, decoding, filtering, and/or formatting, and generate output signals. The output signals may include audio and/or video signals in standard and/or high definition formats. The output signals may be communicated to the network interface 685 and/or to the display 681. The display 681 may include a television, a projector, and/or a monitor.

The power supply 682 provides power to the components of the set top box 678. Memory 683 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 684 may include an optical storage drive, such as a DVD drive, and/or a hard disk drive (HDD).

Referring now to FIG. 9H, the teachings of the disclosure can be implemented in memory 692 of a mobile device 689. The mobile device 689 may include a mobile device control module 690, a power supply 691, memory 692, a storage device 693, a network interface 694, and an external interface 699. If the network interface 694 includes a wireless local area network interface, an antenna (not shown) may be included.

The mobile device control module 690 may receive input signals from the network interface 694 and/or the external interface 699. The external interface 699 may include USB, infrared, and/or Ethernet. The input signals may include compressed audio and/or video, and may be compliant with the MP3 format. Additionally, the mobile device control module 690 may receive input from a user input 696 such as a keypad, touchpad, or individual buttons. The mobile device control module 690 may process input signals, including encoding, decoding, filtering, and/or formatting, and generate output signals.

The mobile device control module 690 may output audio signals to an audio output 697 and video signals to a display 698. The audio output 697 may include a speaker and/or an output jack. The display 698 may present a graphical user interface, which may include menus, icons, etc. The power supply 691 provides power to the components of the mobile device 689. Memory 692 may include random access memory (RAM) and/or nonvolatile memory.

Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 693 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A level shifter, comprising:
    a level shifter module configured to i) receive a first input signal having high and low states and at least one voltage supply signal, and ii) generate a latch control signal based on the high and low states of the first input signal; and
    a latch module configured to:
        receive the latch control signal, a data input signal, and the at least one voltage supply signal;
        selectively store data associated with the data input signal based on the latch control signal;
        selectively change the at least one voltage supply signal from a first level to a second level and output the data according to the second level based on the latch control signal;
        receive at least one second voltage supply signal;
        change the at least one second voltage supply signal from a third level to the first level when the first input signal is in the low state; and
        output the data according to the first level.

2. The level shifter of claim 1, wherein the latch module is configured to i) selectively store the data associated with the data input signal when the first input signal is in the high state, and ii) selectively change the at least one voltage supply signal from the first level to the second level and output the data when the first input signal is in the low state.

3. The level shifter of claim 1 wherein, the latch module is configured to output the data according to the first level when the first input signal is in the low state.

4. A level shifter, comprising:
    a level shifter module configured to i) receive a first input signal having high and low states and at least one voltage supply signal, and ii) generate a latch control signal based on the high and low states of the first input signal;
    a latch module configured to:
        receive the latch control signal, a data input signal, and the at least one voltage supply signal;
        selectively store data associated with the data input signal based on the latch control signal; and
        selectively change the at least one voltage supply signal from a first level to a second level and output the data according to the second level based on the latch control signal; and
    a power supply module configured to generate the at least one voltage supply signal.

5. The level shifter of claim 1, wherein the latch module includes a transistor, the transistor being configured to i) receive the latch control signal and ii) communicate the data based on the latch control signal.

6. The level shifter of claim 1, wherein the latch module includes first and second inverters configured to receive the data based on the latch control signal.

7. A level shifter comprising:
    a level shifter module configured to i) receive a first input signal having high and low states and at least one voltage supply signal, and ii) generate a latch control signal based on the high and low states of the first input signal; and
    a latch module configured to:
        receive the latch control signal, a data input signal, and the at least one voltage supply signal;
        selectively store data associated with the data input signal based on the latch control signal; and
        selectively change the at least one voltage supply signal from a first level to a second level and output the data according to the second level based on the latch control signal,
    wherein the latch module includes at least one logic gate configured to i) receive the data input signal and a data transfer signal and ii) output the data based on the data input signal and the data transfer signal.

8. The level shifter of claim 1, wherein the latch module includes:
    a first logic gate configured to i) receive the data input signal and a logic control signal, and ii) output the data based on the data input signal and the logic control signal; and
    a second logic gate configured to i) receive the data and a data transfer signal and ii) output the data based on the data transfer signal,
    wherein the logic control signal is based on the at least one voltage supply signal.

9. A level shifter, comprising:
    a level shifter module configured to i) receive a first input signal having high and low states and at least one voltage supply signal, and ii) generate a latch control signal based on the high and low states of the first input signal;
    a latch module configured to:
        receive the latch control signal, a data input signal, and the at least one voltage supply signal;
        selectively store data associated with the data input signal based on the latch control signal; and
        selectively change the at least one voltage supply signal from a first level to a second level and output the data according to the second level based on the latch control signal; and
    at least one second latch module configured to i) receive the latch control signal, a second data input signal, and the at least one voltage supply signal, ii) store second data associated with the second data input signal when the first input signal is in the high state, iii) change the at least one voltage supply signal from the first level to the second level when the first input signal is in the low state, and iv) output the second data according to the second level.

10. The level shifter of claim 9, wherein the second latch module is configured to output the second data based on the second level when the first input signal is in the low state.

11. A system comprising the level shifter of claim 1 and further comprising memory configured to receive the data from the latch module.

12. A method for operating a level shifter, the method comprising:

receiving a first input signal having high and low states and at least one voltage supply signal at a level shifter;
generating a latch control signal based on the high and low states of the first input signal at the level shifter;
receiving the latch control signal, a data input signal, and the at least one voltage supply signal at a latch module;
selectively storing data associated with the data input signal based on the latch control signal;
selectively changing the at least one voltage supply signal from a first level to a second level and outputting the data according to the second level based on the latch control signal;
receiving at least one second voltage supply signal;
changing the at least one second voltage supply signal from a third level to the first level when the first input signal is in the low state; and
outputting the data according to the first level.

13. The method of claim 12, further comprising:
selectively storing the data associated with the data input signal when the first input signal is in the high state; and
selectively changing the at least one voltage supply signal from the first level to the second level and outputting the data when the first input signal is in the low state.

14. The method of claim 12, further comprising outputting the data according to the first level when the first input signal is in the low state.

15. The method of claim 12, further comprising:
providing first and second inverters; and
receiving the data at the first and second inverters based on the latch control signal.

16. A method for operating a level shifter, the method comprising:
receiving a first input signal having high and low states and at least one voltage supply signal at a level shifter;
generating a latch control signal based on the high and low states of the first input signal at the level shifter;
receiving the latch control signal, a data input signal, and the at least one voltage supply signal at a latch module;
selectively storing data associated with the data input signal based on the latch control signal;
selectively changing the at least one voltage supply signal from a first level to a second level and outputting the data according to the second level based on the latch control signal;
providing at least one logic gate;
receiving the data input signal and a data transfer signal at the at least one logic gate; and
outputting the data from the at least one logic gate based on the data input signal and the data transfer signal.

17. The method of claim 12, further comprising:
providing a first logic gate that receives the data input signal and a logic control signal, and that outputs the data based on the data input signal and the logic control signal; and
providing a second logic gate that receives the data and a data transfer signal and that outputs the data based on the data transfer signal,
wherein the logic control signal is based on the at least one voltage supply signal.

18. The method of claim 12, further comprising:
receiving the latch control signal, a second data input signal, and the at least one voltage supply signal at a second latch module;
storing second data associated with the second data input signal when the first input signal is in the high state;
changing the at least one voltage supply signal from the first level to the second level when the first input signal is in the low state; and
outputting the second data according to the second level.

19. The method of claim 18, further comprising outputting the second data according to the second level when the first input signal is in the low state.

20. The method of claim 12, further comprising receiving the data from the latch module with at least one of volatile and nonvolatile memory.

* * * * *